(12) United States Patent
Ookawauchi

(10) Patent No.: US 10,229,871 B2
(45) Date of Patent: Mar. 12, 2019

(54) LEAD FRAME

(71) Applicant: OHKUCHI MATERIALS CO., LTD., Kagoshima (JP)

(72) Inventor: Ryuuji Ookawauchi, Kagoshima (JP)

(73) Assignee: OHKUCHI MATERIALS CO., LTD., Kagoshima (JP)

( * ) Notice: Subject to any disclaimer, the term of this patent is extended or adjusted under 35 U.S.C. 154(b) by 0 days.

(21) Appl. No.: 15/836,044

(22) Filed: Dec. 8, 2017

(65) Prior Publication Data

US 2018/0166368 A1 Jun. 14, 2018

(30) Foreign Application Priority Data

Dec. 9, 2016 (JP) ................. 2016-239640

(51) Int. Cl.
*H01L 23/00* (2006.01)
*H01L 23/31* (2006.01)
*H01L 23/50* (2006.01)
*H01L 23/495* (2006.01)
*H01L 21/48* (2006.01)

(52) U.S. Cl.
CPC .... *H01L 23/49582* (2013.01); *H01L 21/4828* (2013.01); *H01L 23/00* (2013.01); *H01L 23/31* (2013.01); *H01L 23/3114* (2013.01); *H01L 23/49503* (2013.01); *H01L 23/49541* (2013.01); *H01L 23/50* (2013.01); *H01L 23/564* (2013.01)

(58) Field of Classification Search
None
See application file for complete search history.

(56) References Cited

U.S. PATENT DOCUMENTS

| | | | |
|---|---|---|---|
| 6,451,627 B1 * | 9/2002 | Coffman | H01L 21/4832 257/E23.054 |
| 7,521,295 B2 * | 4/2009 | Iitani | H01L 21/4821 438/111 |
| 8,089,159 B1 * | 1/2012 | Park | H01L 21/4832 257/773 |

(Continued)

FOREIGN PATENT DOCUMENTS

| | | |
|---|---|---|
| JP | 2008-270512 | 11/2008 |
| JP | 4852802 | 11/2011 |
| JP | 2012-49323 | 3/2012 |

*Primary Examiner* — Erik T. K. Peterson
(74) *Attorney, Agent, or Firm* — Wenderoth, Lind & Ponack, L.L.P.

(57) ABSTRACT

A lead frame includes a metal plate, having a surface partitioned, by a concavity, into columnar areas, and a plating layer including stacked Ni, Pd and Au layers on the surface at top faces of the columnar areas, to form columnar pieces, which serve as internal connecting terminals, respectively, or as internal connecting terminals and pads, respectively. Each of the columnar pieces has, around a circumference of an upper portion thereof, curved regions intervening between straight regions. In each curved region, a side face of the plating layer protrudes outwardly in a horizontal direction from an uppermost portion of a side face of the metal plate in each of the columnar pieces. At a center of each straight region, the side face of the plating layer has substantially a same horizontal position as the uppermost portion of the side face of the metal plate in each of the columnar pieces.

4 Claims, 6 Drawing Sheets

(56) References Cited

U.S. PATENT DOCUMENTS

| | | | |
|---|---|---|---|
| 2005/0056916 A1* | 3/2005 | Sakamoto | H01L 21/4821 257/672 |
| 2006/0127690 A1* | 6/2006 | Ueda | C23F 1/02 428/596 |
| 2007/0042585 A1* | 2/2007 | Sakai | H01L 21/4828 438/592 |
| 2008/0048311 A1* | 2/2008 | Ikenaga | H01L 21/4828 257/690 |
| 2008/0079127 A1* | 4/2008 | Gerber | H01L 21/4828 257/676 |
| 2008/0174012 A1* | 7/2008 | Otsuki | H01L 21/4828 257/737 |
| 2009/0034225 A1* | 2/2009 | Shoji | H01L 21/4832 361/809 |
| 2010/0301465 A1* | 12/2010 | Shoji | H01L 21/4832 257/676 |
| 2011/0169151 A1* | 7/2011 | Camacho | H01L 21/4832 257/676 |
| 2011/0267789 A1* | 11/2011 | Chew | H01L 21/4832 361/767 |
| 2012/0038036 A1* | 2/2012 | Chun | H01L 21/4832 257/677 |
| 2012/0119342 A1* | 5/2012 | Chang Chien | H01L 21/4832 257/676 |
| 2012/0181680 A1* | 7/2012 | Li | H01L 21/4832 257/676 |
| 2013/0154072 A1* | 6/2013 | Do | H01L 23/49541 257/676 |

\* cited by examiner

A-A SECTION

B-B SECTION

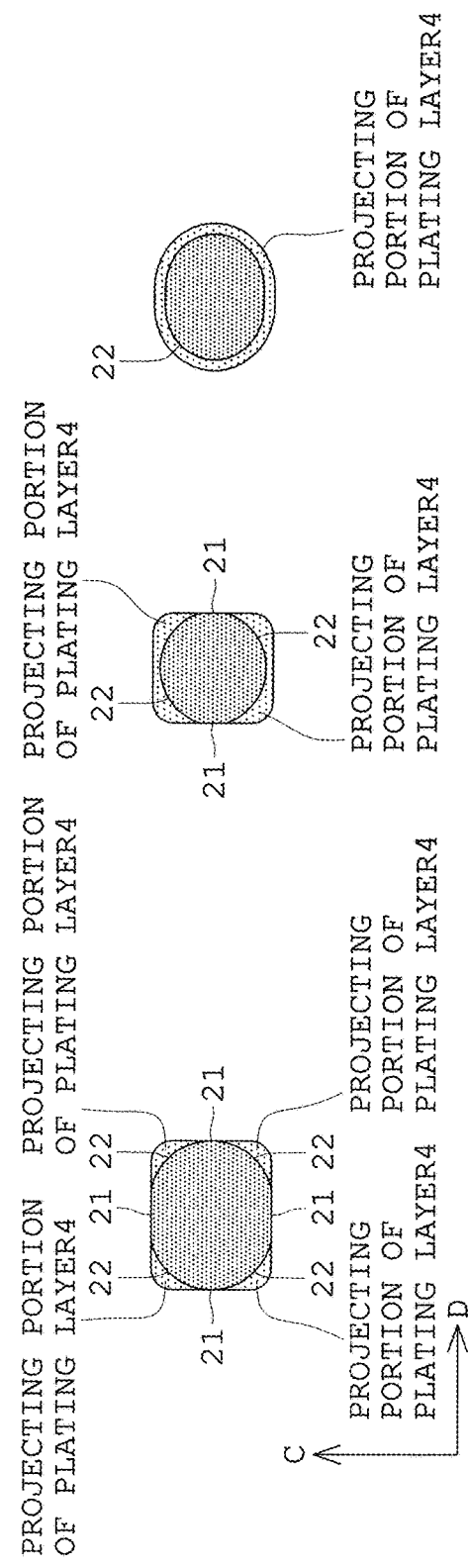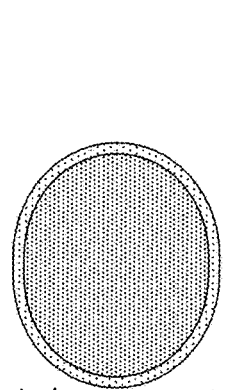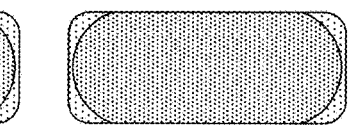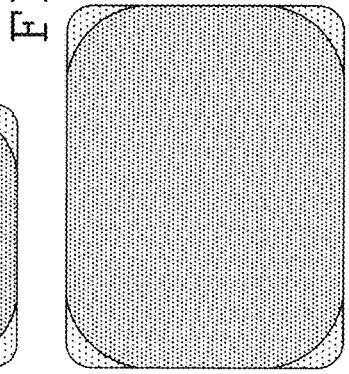

LEAD FRAME

CROSS-REFERENCE TO RELATED PATENT APPLICATIONS

This application claims the benefit of Japanese Patent Application No. 2016-239640 filed in Japan on Dec. 9, 2016, the contents of which are incorporated herein by reference.

BACKGROUND OF THE INVENTION

1) Field of the Invention

The present invention relates to a lead frame used for manufacturing a QFN package (Quad Flat Non-leaded Package).

2) Description of Related Art

Downsizing of semiconductor devices (packages) is being forwarded mainly for application to mobile devices. As lead frames to meet the demand for downsizing of the packages, there have been proposed QFN lead frames, in which external connecting terminals are formed on the lower side. In the terminals of this type of lead frame, in general, a so-called PPF (Pre-Plating Frame) plating layer composed of Ni, Pd and Au layers overlaid one on another in this order is made to laminate the upper surface of a copper material as a substrate, for example as described in Japanese Patent Application Laid-Open (KOKAI) No. 2008-270512.

The lead frame described in JP KOKAI No. 2008-270512 is manufactured by forming Ni, Pd and Au plating layers in this order after shaping of a lead frame provided with terminals by subjecting a metal plate, as a substrate of the lead frame, to etching or the like.

The present applicant has proposed a manufacturing method in which a lead frame is shaped after a PPF plating layer is formed by plating of a metal plate, at sites corresponding to terminal portions, with Ni, Pd and Au in this order, as described in Japanese Patent No. 4852802.

Japanese Patent Application Laid-Open (KOKAI) No. 2012-49323 describes that, in a lead frame manufactured by the method in which the lead frame is shaped by etching after a PPF plating layer is formed by plating of predetermined sites on a metal plate with Ni, Pd and Au, the Ni plating layer is formed to have 5 to 50 μm thickness for inhibiting corrosion into the side face thereof caused by etching.

SUMMARY OF THE INVENTION

A lead frame according to some embodiments of the present invention includes: a metal plate, a surface of which is partitioned, by a concavity formed thereon, into a plurality of columnar areas, and a plating layer including a layer of a base metal and a layer of a noble metal overlaid one on another on the surface of the metal plate at top faces of the plurality of columnar areas, to thereby form a plurality of columnar pieces, which are to serve as internal connecting terminals, respectively, or as internal connecting terminals and pads, respectively. Each of the columnar pieces has, around a circumference of an upper portion thereof, straight regions and curved regions intervening between the straight regions. In each of the curved regions, a side face of the plating layer protrudes outwardly in a horizontal direction from an uppermost portion of a side face of the metal plate in each of the columnar pieces. At a center of each of the straight regions, the side face of the plating layer has substantially the same horizontal position as the uppermost portion of the side face of the metal plate in each of the columnar pieces.

This and other features of the present invention will become apparent from the following detailed description of the preferred embodiments when taken in conjunction with the accompanying drawings.

BRIEF DESCRIPTION OF THE DRAWINGS

FIG. 1A is a plan view, FIG. 1B is a cross-sectional view taken along A-A in FIG. 1A, and FIG. 1C is a cross-sectional view taken along B-B in FIG. 1A.

FIGS. 2A-2I are explanatory diagrams for showing size and shape of the top face of a plating layer formed on the upper portion of a columnar piece and a formation range of protruding portions of the plating layer, regarding lead frames according to one embodiment of the present invention and regarding lead frames according to reference examples, where FIGS. 2A-2F are plan views of columnar pieces in lead frames according to one embodiment of the present invention, and FIGS. 2G-2I are plan views of columnar pieces in lead frames according to the reference examples.

FIG. 3A is a picture that shows side faces of the columnar pieces as viewed from the obliquely upper side, FIG. 3B is a picture that shows a side face, in a curved region, of an internal connecting terminal, which forms a columnar piece, as viewed from the lateral side, FIG. 3C is a picture that shows a side face, in a straight region, of the internal connecting terminal as viewed from a lateral side, FIG. 3D is a picture that shows a side face, in a curved region, of a pad, which forms a columnar piece, as viewed from a lateral side, and FIG. 3E is a picture that shows a side face, in a straight region, of the pad as viewed from a lateral side.

FIG. 4A is a diagram that shows the state before the etching process, and FIG. 4B shows the state after the etching process.

FIG. 5G is a diagram that shows the state before the etching process, and FIG. 5B is a diagram that shows the state after the etching process.

FIG. 6A is a picture that shows side faces of the columnar pieces as viewed from the obliquely upper side, FIG. 6B is a picture that shows a side face of a columnar piece as viewed from the lateral side, and FIG. 6C is a picture that shows an enlarged view of a part of FIG. 6B.

DETAILED DESCRIPTION OF THE PREFERRED EMBODIMENTS

Preceding the explanation of embodiments, the process of introducing the lead frame according to the present invention and the function and effect thereof will be explained.

Figure 4A:
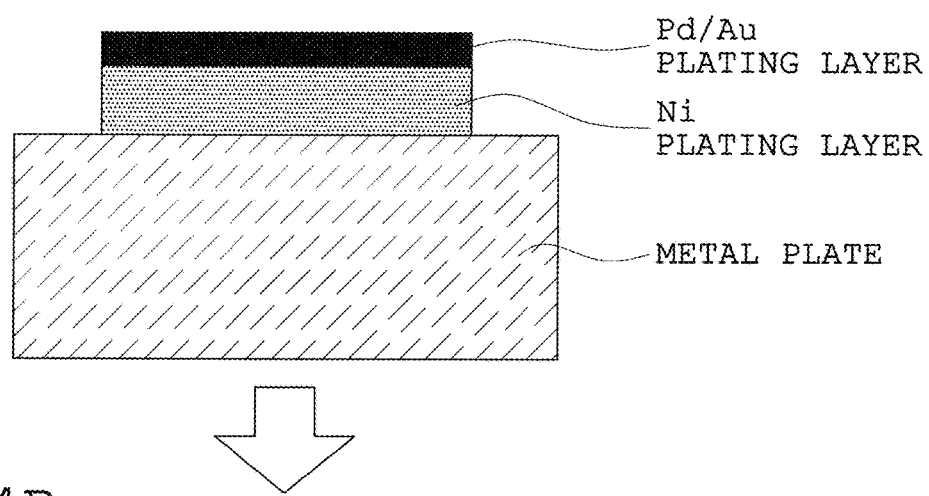
FIGS. 4A-4B are explanatory diagrams for schematically showing a plating layer of a lead frame manufactured by a method in which a lead frame shape is formed via an etching process after formation of a conventional PPF plating layer, where
Figure 4B:
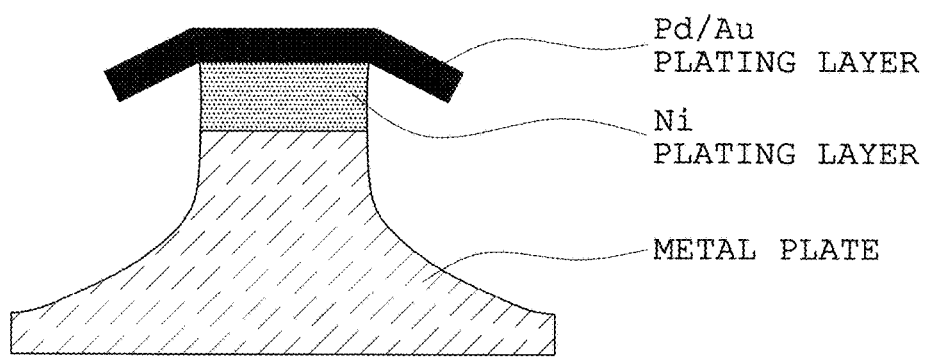

If predetermined sites on a metal plate, as a lead frame substrate, is plated sequentially with Ni, Pd, and Au to form a PPF plating layer (see FIG. 4A) and then a lead frame shape is formed by etching process, a certain amount of the Ni plating layer is liable to be etched together with the substrate during the etching process. If the Ni plating layer is etched, as shown in FIG. 4B, the Pd and Au plating layers protrude by a certain amount from around the remaining, non-etched part of the Ni layer, to form a burr, which would be broken or chipped, to be a cause of a failure. As a result, if a semiconductor device is manufactured upon use of such a lead frame, its reliability would be degraded.

Also, regarding a lead frame with a thickened Ni plating layer, the increased thickness of the Ni plating layer would raise the manufacturing cost because of a large material loss and would lower the manufacturing efficiency for a considerable time spent to perform Ni plating.

Figure 5A:
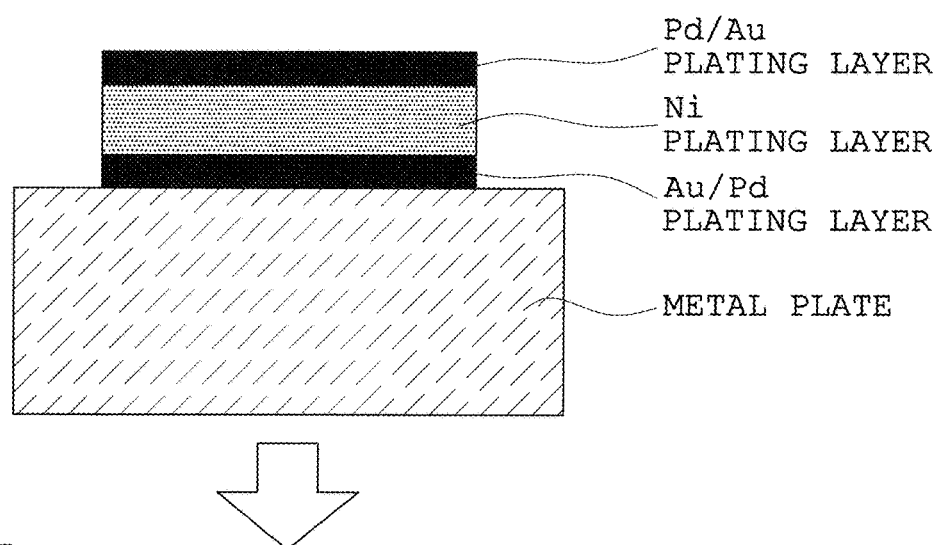
FIGS. 5A-5B are explanatory diagrams for schematically showing a lead frame that was formed in the course of try and error of the present inventor for introducing the present invention, where
Figure 5B:
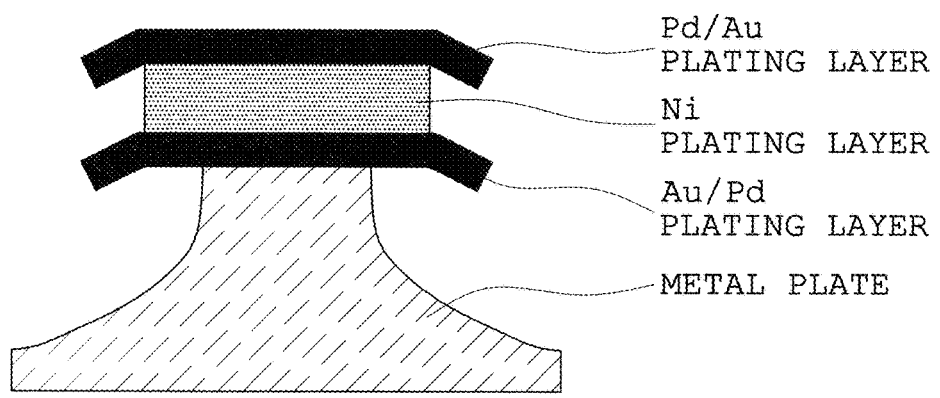

In this course, the present inventor got an idea of sequentially providing, between the upper surface of the metal plate and the plating layer composed of Ni, Pd and Au layers overlaid one on another, layers made of Au and Pd from the upper-surface side of the metal plate, as a barrier layer against etching to the Ni plating layer, so that the plating layer is configured to be totally composed of Au, Pd, Ni, Pd, and Au layers overlaid one on another in this order. Thus, after plating predetermined sites on a metal frame, as a lead frame substrate, with Au, Pd, Ni, Pd and Au in this order to form a PPF plating layer (see FIG. 5A) and then performing etching to shape a lead frame, the present inventor observed the etched state of the PPF plating layer.

As a result of the etching of the plating layer, while a concavity was formed to shape columnar pieces that were to serve as internal connecting terminals, respectively, or internal connecting terminals and pads, respectively, the back surface of the plating layer (that is, the back surface of the Au plating layer constituting the barrier layer) remained without being etched. However, regarding the Ni plating layer on above the barrier layer, etching had progressed from the lateral side, so that the Au and Pd layers constituting the barrier layer and the Pd and Au layers on the top side protruded a certain amount, to form burrs, and the burrs caused breakage and chipping.

Also, this method raised the problem of increased manufacturing cost and decreased manufacturing efficiency owing to the added processes for forming Au and Pd plating layers constituting a barrier layer.

Based on these results, the present inventor further went on various try and error, and study and examination regarding etching method which could inhibit etching progress into the Ni plating layer without increasing manufacturing cost or decreasing manufacturing efficiency.

Finally, it was found that, while burrs generated by protrusion of a plating layer are, if generated around the full circumference of the upper portion of the columnar piece, liable to be broken or chipped, they are, if generated intermittently, hard to be broken or chipped.

Therefore, the present inventor has introduced the present invention through the concept that an etching process such as not to allow burrs, if generated by protrusion of a plating layer, to continuously reside around the circumference in the upper portion of the columnar piece can prevent the burrs from being broken or chipped.

A lead frame according to some embodiments of the present invention includes: a metal plate, a surface of which is partitioned, by a concavity formed thereon, into a plurality of columnar areas, and a plating layer including layers of Ni, Pd and Au overlaid one on another in this order on the surface of the metal plate at top faces of the plurality of columnar areas, to thereby form a plurality of columnar pieces, which are to serve as internal connecting terminals, respectively, or as internal connecting terminals and pads, respectively. Each of the columnar pieces has, around a circumference of the upper portion thereof, straight regions and curved regions intervening between the straight regions. In each of the curved regions, a side face of the plating layer protrudes outwardly in a horizontal direction from an uppermost portion of a side face of the metal plate in each of the columnar pieces. At a center of each of the straight regions, the side face of the plating layer has substantially the same horizontal position as the uppermost portion of the side face of the metal plate in each of the columnar pieces.

The side face of the plating layer having substantially the same horizontal position, at a center of a straight portion, as the uppermost portion of the side face of the metal plate in a columnar piece includes a situation where a horizontal position of the side face of the plating layer, at the center of the straight region, coincides with a horizontal position of the uppermost portion of the side face of the metal plate in the columnar piece. In addition, the side face of the plating layer having substantially the same horizontal position also includes the situation where the side face of the plating layer, at the center of the straight region, protrudes 5 μm or shorter outwardly in a horizontal direction from the uppermost portion of the side face of the metal plate in the columnar piece.

If the configuration is made as in the lead frame of some embodiments of the present invention, the side face of the plating layer, in curved regions alone, protrudes outwardly in horizontal directions from the uppermost portion of the side face of the metal plate in a columnar piece, while, at the remaining, centers of straight regions, the side face of the plating layer does not substantially protrude outwardly in horizontal directions from the uppermost portion of the side face of the metal plate in the columnar piece, and thus largely protruding burrs are not generated continuously around the circumference, but are formed only intermittently and in a smallest range. At the center of a straight region, since the side face of the plating layer is reinforced by the metal plate that remains as having substantially the same horizontal position, even if it slightly protrudes outwardly in a horizontal direction from the uppermost portion of the side face of the metal plate in the columnar piece to generate a burr, the burr is hardly broken or chipped. Also, in a curved region, since a burr generated by protrusion of the side face of the plating layer is joined to both of the adjacent straight regions of the plating layer reinforced by the metal plate, it is hardly broken or chipped.

In this way, the lead frame according to some embodiments of the present invention can prevent burrs of the PPF plating layer from being broken or chipped.

Furthermore, since it is not necessary to thicken the Ni plating layer or to provide, as in the lead frame conceived by the present inventor before he introduced the present invention, additional plating layers made of Au and Pd arranged in this order from the metal-plate side as a barrier against etching to the Ni plating layer, increase in manufacturing cost and decrease in manufacturing efficiency can be avoided.

The side face of the plating layer, in a curved region, is formed to protrude preferably 5 to 50 µm outwardly in a horizontal direction from the uppermost portion of the side face of the metal plate in a columnar piece. Such a degree of burr protrusion hardly causes breakage or chipping of the burr.

Also, the plating layer composed of Ni, Pd and Au layers overlaid one on another preferably has a total thickness of 5 µm or less. Such a configuration allows a material loss to be reduced, and can further prevent increased manufacturing cost and decreased manufacturing efficiency.

The lead frame of some embodiments of the present invention can be manufactured by a procedure including a process of forming a plating layer by plating, sequentially with Ni, Pd and Au, a copper plate at sites corresponding to columnar pieces that are to serve as internal connecting terminals, respectively, or as internal connecting terminals and pads, respectively, and a process of forming the columnar pieces by subjecting the copper plate, at an area surrounding the plating layer, to half-etching using an etching solution that contains an etching inhibitor having affinity with copper.

In a case where half-etching is conducted from the upper-surface side of the copper plate, if a normal etching solution is used, the etching process progresses orderly from the upper-surface side toward the lower-surface side, and a side face of the plating layer forms a burr protruding outwardly in horizontal directions around the full circumference of the upper portion of each columnar piece.

In contrast, if an etching solution that contains an etching inhibitor having affinity to copper is used, the etching inhibitor is adsorbed to the upper-surface side of the copper plate at sites that are to be shaped into columnar pieces, which are intended to remain after the half-etching process for serving as internal connecting terminals, respectively, or as internal connecting terminals and pads, respectively, and the etching process at those sites is easily inhibited. In shaping each columnar piece, progress of the etching to the metal plate at sites corresponding to the upper portion of the side face of the columnar piece is retarded along straight regions of the columnar piece owing to the property of the etching inhibitor having affinity to copper. On the other hand, in a curved region positioned between the adjacent straight regions, the etching solution flowing along two different directions of the straight regions turns in so fast that the etching inhibitor is harder to be adsorbed there than in the straight regions, and thus the etching process in the upper portion of the side face progresses faster in the curved regions than in the straight regions. As a result, there is formed a lead frame in which, in each of columnar pieces, the side face of the plating layer, in each of curved regions, protrudes outwardly in a horizontal direction from the uppermost portion of the side face of the metal plate, and the side face of the plating layer, at the center of each of straight regions, has substantially the same horizontal position as the uppermost portion of the side face of the metal plate and scarcely protrudes.

As described above, according to some embodiments, regarding QFN lead frames manufactured by a method in which a PPT plating layer is formed on a metal plate as a lead frame substrate and then the lead frame shape is formed through etching process, it is possible to attain lead frames that can avoid increased manufacturing cost and decreased manufacturing efficiency and that can prevent breakage or chipping of burrs of the PPF plating layer.

Embodiment

Hereinafter, one embodiment of the present invention will be described in reference to the drawings.

Figure 1A:
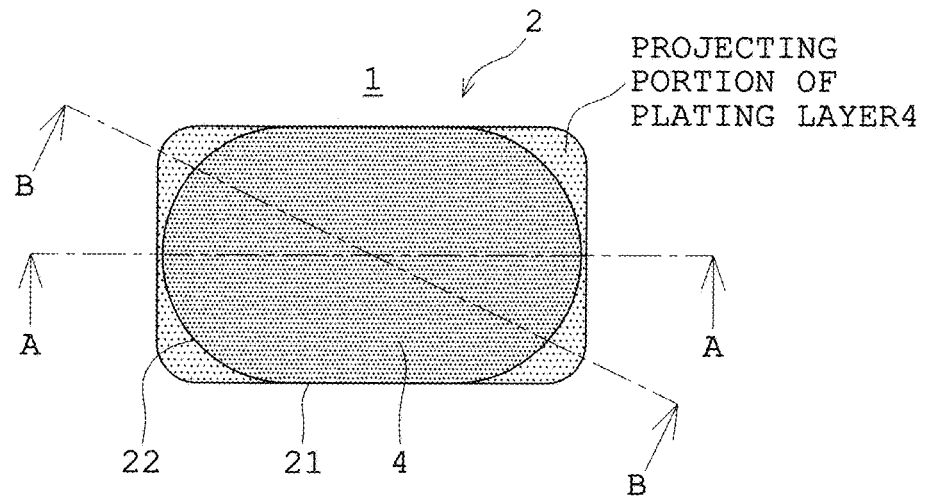
FIGS. 1A-1C show a configuration of one of columnar pieces formed in columnar areas into which a metal plate is partitioned by a concavity formed thereon according to one embodiment of the present invention, where
Figure 1B:
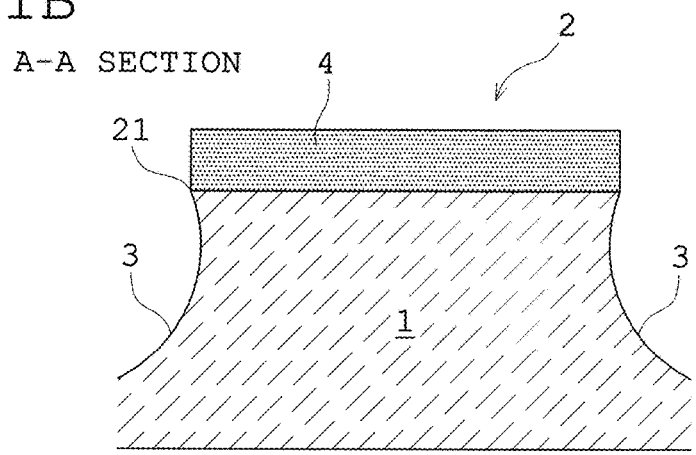
Figure 1C:
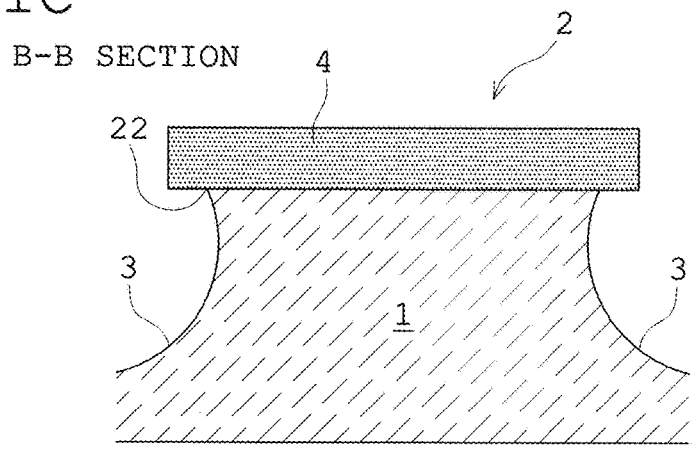

FIGS. 1A-1C show a configuration of one of columnar pieces formed in columnar areas into which a metal plate is partitioned by a concavity formed thereon according to one embodiment of the present invention, where FIG. 1A is a plan view, FIG. 1B is a cross-sectional view taken along A-A in FIG. 1A, and FIG. 1C is a cross-sectional view taken along B-B in FIG. 1A.

FIGS. 2A-2I are explanatory diagrams for showing size and shape of the top face of a plating layer formed on the upper portion of a columnar piece and a formation range of protruding portions of the plating layer, regarding lead frames according to one embodiment of the present invention and regarding lead frames according to reference examples, where FIGS. 2A-2F are plan views of columnar pieces in lead frames according to one embodiment of the present invention, and FIGS. 2G-2I are plan views of columnar pieces in lead frames according to the reference examples.

Figure 3A:
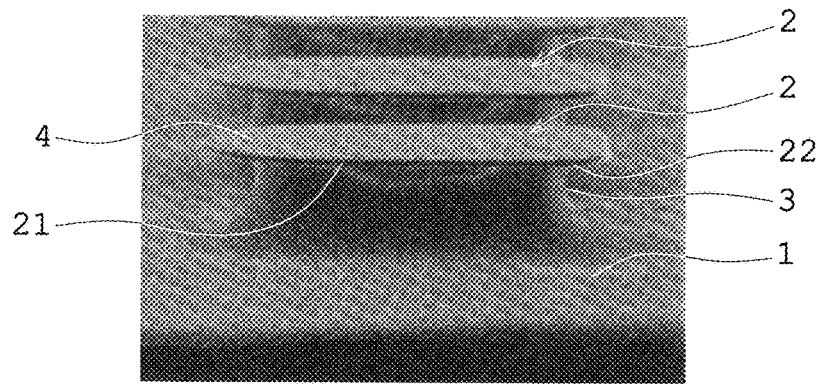
FIGS. 3A-3E are photographs that show a configuration of columnar pieces formed in columnar areas into which a metal plate is partitioned by a concavity, in a lead frame according to one embodiment of the present invention, where
Figure 3B:
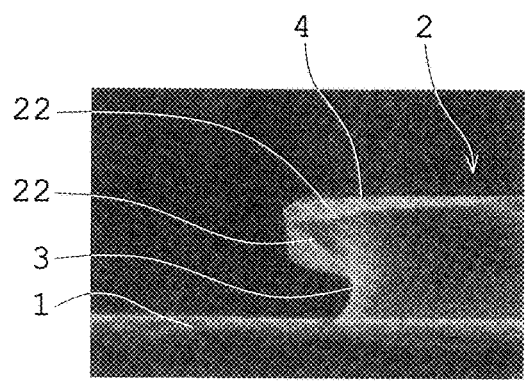
Figure 3C:
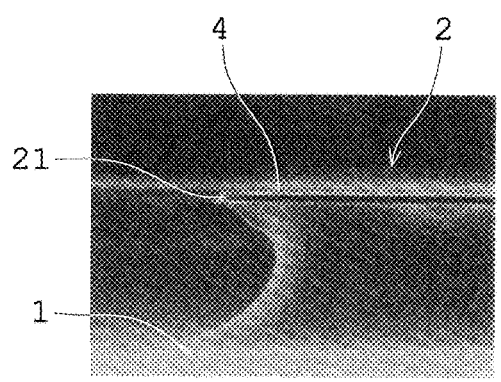
Figure 3D:
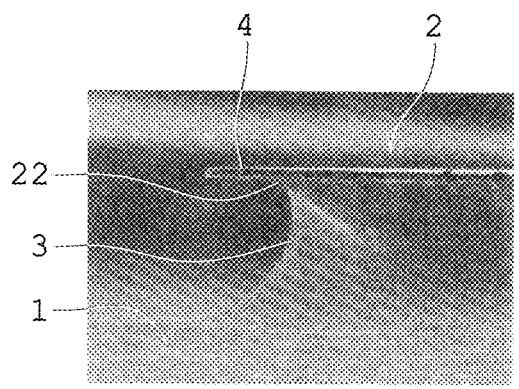
Figure 3E:
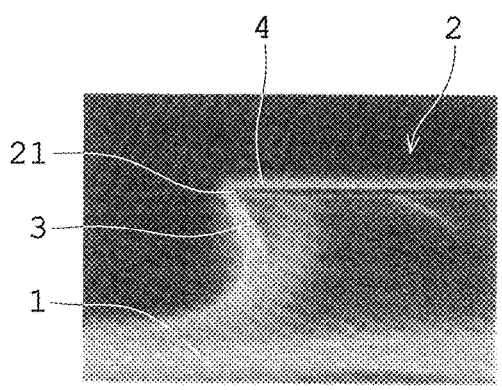

FIGS. 3A-3E are photographs that show a configuration of columnar pieces formed in columnar areas into which a metal plate is partitioned by a concavity, in a lead frame according to one embodiment of the present invention, where FIG. 3A is a picture that shows side faces of the columnar pieces as viewed from the obliquely upper side, FIG. 3B is a picture that shows a side face, in a curved region, of an internal connecting terminal, which forms a columnar piece, as viewed from the lateral side, FIG. 3C is a picture that shows a side face, in a straight region, of the internal connecting terminal as viewed from a lateral side, FIG. 3D is a picture that shows a side face, in a curved region, of a pad, which forms a columnar piece, as viewed from a lateral side, and FIG. 3E is a picture that shows a side face, in a straight region, of the pad as viewed from a lateral side.

As shown in FIGS. 1A-1C, in the lead frame of one embodiment of the present invention, a surface of a metal plate 1 is partitioned by a concavity 3 formed thereon into a plurality of columnar areas that are to form columnar pieces 2 serving as internal connecting terminals, respectively, or internal connecting terminals and pads, respectively.

The upper portion of the columnar piece 2 is provided with a plating layer 4 formed of Ni, Pd and Au layers overlaid one on another in this order from the upper-surface side of the metal plate 1. It is preferable that the plating layer 4 is formed to have a total thickness of 5 µm or less.

Around the circumference of the upper portion of the columnar piece 2, straight regions 21 and curved regions 22 intervening between the straight regions 21 are provided. The curved regions 22 are shaped to be curved.

A side face of the plating layer 4, in each of the curved regions 22, protrudes 5 to 50 µm outwardly in a horizontal direction from the uppermost portion of a side face of the metal plate 1 in the columnar piece.

The side face of the plating layer 4, at the center of each of the straight regions 21, has substantially the same horizontal position as the uppermost portion of the side face of the metal plate 1 in the columnar piece (i.e. the position where the side face of the plating layer 4 protrudes within the range of 0 to 5 μm outwardly in a horizontal direction from the uppermost portion of the side face of the metal plate 1 as well as where the metal plate 1 does not protrude outwardly in the horizontal direction from the metal plating layer 4). In other words, the plating layer 4 protrudes no more than 5 μm radially outward from the uppermost portion of the respective side face of the metal plate 1 in plan view (i.e., looking down from above at the columnar piece 2, and particularly at the upper surface of the plating layer 4 and the metal plate 1) as shown, for example, in FIGS. 2A-2I (see also FIGS. 1B and 1C which illustrate the above configuration in side elevation views).

A top face of the plating layer 4 formed on the upper portion of the columnar piece 2 in this embodiment has at least two straight sides and, of dimensions measured along two directions across the top face of the plating layer 4, at least a dimension along one direction is 0.3 mm or longer.

For example, as shown in FIGS. 2A-2C, in a case where the top face of the plating layer 4 formed on the upper portion of the columnar piece 2 has four straight sides and both of the dimensions, along two directions, of the top face of the plating layer 4 are 0.3 mm or longer, the metal plate 1 forms four straight regions 21, at the center of each of which the side face of the plating layer 4 has substantially the same horizontal position as the uppermost portion of the metal plate 1 without protruding outwardly in a horizontal direction from the uppermost portion of the side face of the metal plate 1, and, only in four curved regions 22, the side face of the plating layer 4 protrudes outwardly in horizontal directions from the uppermost portion of the side face of the metal plate 1. Also, if the size of the top face of the plating layer 4 formed on the upper portion of the columnar piece 2 is made larger, the formation range and size of the protruding portions of the plating layer 4 scarcely varies. Furthermore, in the straight regions 21, since the side face of the plating layer 4 has substantially the same horizontal position as the uppermost portion of the side face of the metal plate 1, the range free from outwardly protruding portions is widened.

Also, for example, as shown in FIGS. 2D-2F, in a case where the top face of the plating layer 4 formed on the upper portion of the columnar piece 2 has four straight sides with a dimension along one direction (the arrowed direction C in FIG. 2A) of the top face of the plating layer 4 being 0.3 mm or longer and a dimension along another direction (the arrowed direction D in FIG. 2A) of the top face of the plating layer 4 being shorter than 0.3 mm, the metal plate 1 forms two straight regions 21 extending in the direction (the arrowed direction C) along which the dimension of the top face of the plating layer is 0.3 mm or longer, with the side face of the plating layer, at the centers of the two straight regions 21, having substantially the same horizontal positions as the uppermost portion of the metal plate 1 without protruding outwardly in horizontal directions. There are formed, intervening between the straight regions 21 on both ends, two curved regions 22 having a large diameter, only in which the side face of the plating layer 4 protrudes outwardly in horizontal directions from the uppermost portion of the side face of the metal plate 1. Also, in the top face of the plating layer 4 formed on the upper portion of the columnar piece 2, even if the sides thereof extending in the direction (the arrowed direction C) along which the dimension of the top face is 0.3 mm or longer are further elongated, the formation range and size of the protruding portions of the plating layer 4 scarcely varies as long as the sides thereof extending in the other direction (the arrowed direction D) is below 0.3 mm, and, in the straight regions 21, since the side face of the plating layer 4 has substantially the same horizontal position as the uppermost portion of the side face of the metal plate 1, the range free from outwardly protruding portions is widened.

As shown in FIGS. 2D-2F, in the case where the top face of the plating layer 4 has a dimension shorter than 0.3 mm only in one direction, the outward protrusion length of the plating layer 4 in the horizontal direction from the uppermost portion of the side face of the metal plate 1 is small at the center of each of the curved regions 22. Therefore, depending on the dimension in this direction, at the center of each of the curved regions 22, the side face of the plating layer 4 may be formed to have substantially the same horizontal position as the uppermost portion of the side face of the metal plate 1, scarcely protruding outwardly in a horizontal direction from the uppermost portion of the side face of the metal plate 1. In this situation, the protruding portions of the plating layer 4 are formed only at the four corners.

In a case where, unlike the lead frame of this embodiment, the top face of the plating layer 4 formed on the upper portion of the columnar piece 2 does not have a straight side, for example in a situation where the contour thereof is composed only of curved lines over the full circumference, even if the top face of the plating layer 4 has dimensions greater than 0.3 mm or larger in both of the two directions, the side face of the plating layer 4 protrudes from the uppermost portion of the side face of the metal plate 1 outwardly in the horizontal directions over the entire circumference of the columnar piece 2, as shown in FIGS. 2G-2I. Also, the formation range and size of the protruding portion of the plating layer 4 scarcely varies even if the size of the top face of the plating layer 4 is made larger.

The lead frame of this embodiment thus configured can be manufactured, for example as follows. Description of pretreatment and post-treatment including chemical cleaning, aqueous washing and the like carried out in each step of the manufacturing is omitted for convenience's sake.

First, the metal plate 1 is prepared. As the metal plate 1, a copper material is used. Regarding the copper material, those having high strength as used for normal lead frames are desirable, and the thickness is selected usually within the range of 100 to 200 μm in consideration of handling etc.

Then, dry film resists are made to laminate both surfaces of the copper material. While the kind and thickness of the dry film resists are not particularly limited, negative-type ones, in which exposed portions are hardened, are usually used. Alternatively, positive dry film resists may be used. Applying liquidus photoresist may work, also. While the thickness of resist is chosen depending on the line width and interline spacing of the pattern to be formed, those having a thickness of 15 to 40 μm are usually used.

Then, each dry film resist is exposed in accordance with a pattern for forming a plating layer having a predetermined shape at a predetermined position. This is the same as the general method, in which, upon a photomask that carries a pattern being brought into tight contact with a dry film resist, the dry film resist is exposed in accordance with the pattern of the photomask by irradiation with a predetermined dosage of ultraviolet rays. Through this step, the front-surface side, where to mount a semiconductor element, is distinguished from the opposite, back-surface side, where to form external connecting terminals.

Then, development is conducted, to thereby form, on both the surfaces of the copper material, resist masks for plating having openings of predetermined shape.

Then, the copper material is sequentially plated with Ni, Pd and Au at the openings in the resist masks for plating by electroplating, to form a plating layer 4. The total thickness of the plating layer 4 is set to 5 μm or less.

Then, the resist masks for plating are removed.

Then, a resist mask for etching that covers the plating layer 4 is formed on the front-surface side, and a resist mask for etching that covers the entire surface is formed on the back-surface side. The method for forming the resist masks for etching is the same, in laminating, exposure and development of dry film resists, as the above-described method for forming the resist masks for plating.

A photomask used for forming the resist mask for etching on the front-surface side is designed to have an appropriate size of masking portions determined in consideration of the amount of etching and a positional deviation in exposure so that, after half-etching treatment, respective horizontal positions of the side face of the plating layer 4 respectively in the curved regions 22 and at the center of the straight regions 21, and the uppermost portion of the metal plate 1 should be in the relationship as described above.

Then, half-etching is performed via openings in the front-surface side resist mask, to form a concavity 3 by which the front-surface side of the metal plate 1 provided with the plating layer 4 is partitioned into columnar pieces 2.

As an etching solution, a cupric chloride solution containing, as an etching inhibitor, nitrogen or sulfur having affinity to copper is used. Thereby, the etching inhibitor is adsorbed to the upper-surface side of the copper plate at sites that are to be shaped into the columnar pieces 2, which are intended to remain after the half-etching process for serving as internal connecting terminals, respectively, or as internal connecting terminals and pads, respectively, and the etching process at those sites is easily inhibited. In shaping each columnar piece 2, progress of the etching to the copper plate, or the metal plate 1 at sites corresponding to the upper portion of the side face of the columnar piece 2 is retarded along straight regions 21 of the columnar piece 2 owing to the property of the etching inhibitor having affinity to copper. On the other hand, in a curved region 22 positioned between the adjacent straight regions 21, the etching solution flowing along two different directions of the straight regions 21 turns in so fast that the etching inhibitor is harder to be adsorbed there than in the straight regions 21, and thus the etching process in the upper portion of the side face made of the copper plate as the metal plate 1 progresses faster in the curved regions 22 than in the straight regions 21. As a result, there is formed a lead frame in which, in each of the columnar pieces 2, the side face of the plating layer 4, in each of curved regions 22, protrudes outwardly in a horizontal direction from the uppermost portion of the side face of the metal plate 1, and the side face of the plating layer 4, at the center of each of straight regions 21, has substantially the same horizontal position as the uppermost portion of the side face of the metal plate 1 and scarcely protrudes.

Then, the resist masks are removed. Thereby, a lead frame of one embodiment of the present invention is attained.

In a case where semiconductor devices (packages) are to be manufactured upon use of the lead frame of some embodiments of the present invention, semiconductor elements are mounted on, among the columnar pieces 2 formed on the front-surface side of the lead frame, those serving as pads using die paste or the like, and each of the semiconductor elements are wired-bonded with, among the columnar pieces 2, those serving as internal connecting terminals.

Then, the semiconductor-element-mounting side of the copper material is resin-sealed with an epoxy resin or the like. In this state, the sealing resin is interposed in the concavity 3 of the lead frame, to fix the partitions, or the individual columnar pieces 2.

Then, the copper material is etched upon use of a plating layer formed on the back-surface side as an etching mask, to make terminal portions independent. Then, the entirety is cut into individual package-sized pieces by a method such as dicing.

In this way, packages are obtained.

According to the lead frame of this embodiment, the side face of the plating layer 4, in the curved regions 22 alone, protrudes outwardly in horizontal directions from the uppermost portion of the side face of the metal plate 1 in the columnar piece, while, at the remaining, centers of the straight regions 21, the side face of the plating layer 4 does not substantially protrude outwardly in horizontal directions from the uppermost portion of the side face of the metal plate 1 in the columnar piece, and thus largely protruding burrs are not generated continuously around the circumference, but are formed only intermittently and in a smallest range. At the center of a straight region 21, since the side face of the plating layer 4 is reinforced by the metal plate 1 that remains as having substantially the same horizontal position, even if it slightly protrudes outwardly in a horizontal direction from the uppermost portion of the side face of the metal plate 1 in the columnar piece to generate a burr, the burr is hardly broken or chipped. Also, in a curved region 22, since a burr generated by protrusion of the side face of the plating layer 4 is joined to both of the adjacent straight regions 21 of the plating layer 4 reinforced by the metal plate 1, it is hardly broken or chipped.

Furthermore, since it is not necessary to thicken the Ni plating layer or to provide, as in the lead frame conceived by the present inventor before he introduced the present invention, additional plating layers made of Au and Pd arranged in this order from the metal-plate side as a barrier against etching to the Ni plating layer, increase in manufacturing cost and decrease in manufacturing efficiency can be avoided.

EXAMPLE

Hereafter, an explanation will be made of a lead frame that was fabricated based on the first embodiment of the present invention, as an example.

First, a copper-based alloy material with a thickness of 0.125 mm was used as the metal plate 1, both sides of which were laminated with a dry film resist.

Then, the both sides were exposed in a predetermined pattern and developed, to form resist masks for plating having openings in sites where plating was necessary.

Then, the metal plate was sequentially plated with Ni, Pd, and Au by electroplating through the openings in the resist masks, to form the plating layer 4.

Then, the resist masks for plating were peeled off, the same dry film resist as used before was made to laminate the both surfaces of the metal plate 1 on which the plating layer 4 had been formed, and, on the front-surface side where to mount a semiconductor element, exposure and development were made with a predetermined pattern, to form a plating layer for etching that masked the previously-formed plating layer 4. On the opposite, back-surface side, a resist mask for etching that masked the entire surface was formed.

Then, upon a cupric chloride solution containing, as an etching inhibitor, nitrogen and sulfur having affinity to copper being used as an etching solution, half-etching was performed at a predetermined spraying pressure for several minutes from the front-surface side to a depth of about 80 µm, to form the concavity 3 for partitioning the front-surface side into the columnar pieces 2.

Thereafter, the resist masks on both sides were peeled off, so that the lead frame of this example was obtained (see FIGS. 3A-3E).

The lead frame of this example thus obtained had the following qualities. In each of the curved region 22 of the columnar piece 2 that was to serve as an internal connecting terminal (see FIG. 3B) and the curved region 22 of the columnar piece 2 that was to serve as a pad (see FIG. 3D), the side face of the plating layer 4 in the curved region 22 protrudes about 20 µm outwardly in a horizontal direction from the uppermost portion of the side face of the metal plate 1. On the other hand, in each of the straight region 21 of the columnar piece 2 that was to serve as an internal connecting terminal (see FIG. 3C) and the straight region 21 of the columnar piece 2 that was to serve as a pad (see FIG. 3E), the side face of the plating layer 4 at the center of the straight region 21 had substantially the same horizontal position as the uppermost position of the side face of the metal plate 1, and, even if it protruded outwardly in the horizontal direction, 5 µm was the maximum.

Also, as shown in FIG. 3A, at the end of the plating layer 4 protruding outwardly in the horizontal direction in the curved section 22, there was no breakage of chipping of the film.

Comparative Example

As a comparative example, a lead frame was obtained, upon use of the same material of the resist masks as that used in the above-described example of the embodiment, through a procedure similar to that adopted for the above-described example of the embodiment except in that, in the etching process, half-etching was performed upon use of a ferric chloride solution as an etching solution, which has been conventionally used and in that, in the process of forming a plating layer, the metal plate 1 was sequentially plated with Au and Pd to form a barrier layer for Ni and then plating with Ni, Pd and Au was performed as in the procedure for the above-described example of the embodiment.

Figure 6A:
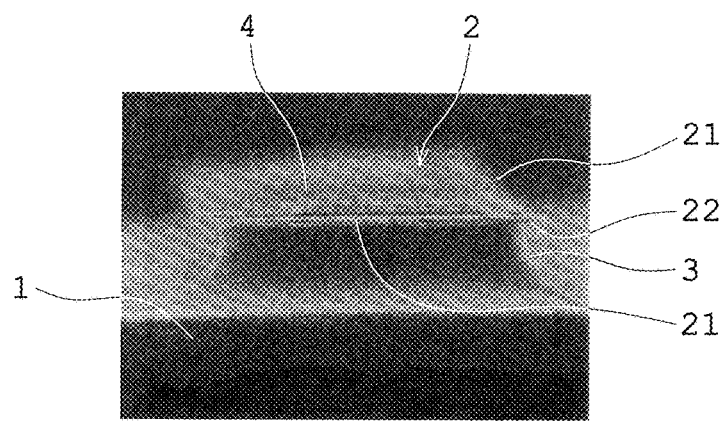
FIGS. 6A-6C are photographs that show a configuration of columnar pieces formed in columnar areas into into which a metal plate is partitioned by a concavity, in a lead frame according to a reference example, where
Figure 6B:
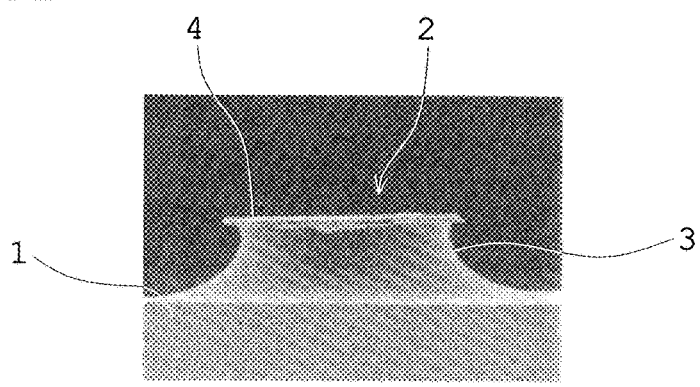
Figure 6C:
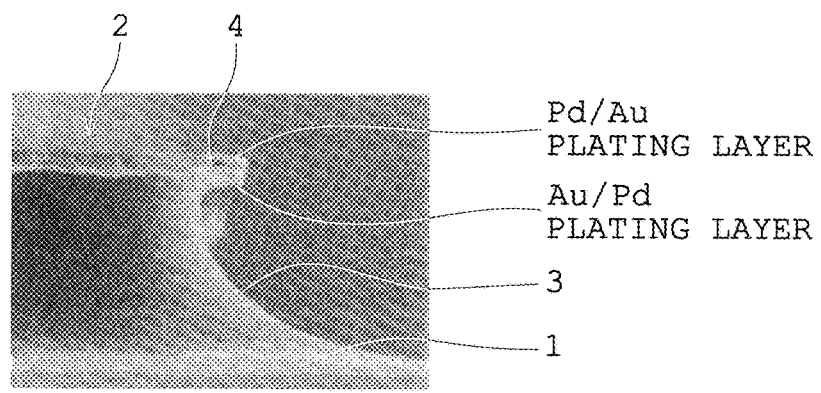

In the lead frame of the comparative example, the side face of the plating layer 4 protruded 25 µm or more from the uppermost portion of the side face of the metal plate 1 over the entire circumference in the upper portion of the columnar piece 2 (see FIG. 6B). In addition, etching progressed into the side face of the Ni plating layer in the plating layer 4 (see FIG. 6C). As a result, the barrier layer composed of Au and Pd overlaid one on another and the Pd and Au layers on above the Ni plating layer formed burrs projecting outwardly in horizontal directions over the entire circumference in the upper portion of the columnar piece 2, and a part of the burrs caused breakage and chipping (see FIGS. 6A and 6C).

What is claimed is:

1. A lead frame comprising:
   a metal plate having a surface partitioned by a concavity formed thereon so as to form a plurality of columnar areas; and
   a plating layer including a layer of a base metal and a layer of a noble metal overlaid one on another on the surface of the metal plate at top faces of the plurality of columnar areas; to thereby form a plurality of columnar pieces, the columnar pieces being configured to serve as respective internal connecting terminals or as respective internal connecting terminals and pads,
   wherein each of the columnar pieces has an upper portion, and a circumference of the upper region of each of the columnar pieces has alternating straight regions and curved regions such that each of the curved regions is arranged between adjacent straight regions in plan view, each of the straight regions having a straight outer boundary in plan view and each of the curved regions having a curved outer boundary in plan view,
   wherein a side face of the plating layer protrudes outwardly in a horizontal direction from an uppermost portion of a side face of the metal plate in each of the curved regions of each of the columnar pieces, and
   wherein, at a center of each of the straight regions of each of the columnar pieces, a position of the side face of the plating layer substantially coincides with a position of a respective uppermost portion of the side face of the metal plate in plan view.

2. The lead frame according to claim 1, wherein the side face of the plating layer protrudes 5 µm to 50 µm outwardly in plan view from the respective uppermost portion of the side face of the metal plate in each of the curved regions of each of the columnar pieces.

3. The lead frame according to claim 1, wherein the plating layer is composed of a Ni layer, a Pd layer, and an Au layer sequentially overlaid one on another in order from a top-face side of the columnar areas, and has a total thickness of 5 µm or less.

4. The lead frame according to claim 2, wherein the plating layer is composed of a Ni layer, a Pd layer, and an Au layer sequentially overlaid one on another in order from a top-face side of the columnar areas, and has a total thickness of 5 µm or less.

\* \* \* \* \*